United States Patent [19]

Foner

[11] 4,005,358
[45] Jan. 25, 1977

[54] MAGNETOMETER WITH OUT-OF-PHASE CORRECTION

[76] Inventor: Simon Foner, 31 Payson Terrace, Belmont, Mass. 02178

[22] Filed: Oct. 7, 1974

[21] Appl. No.: 513,090

[52] U.S. Cl. .............................................. 324/34 R
[51] Int. Cl.² ......................................... G01R 33/12
[58] Field of Search ................. 324/43 R, 47, 34 R, 324/14

[56] References Cited
UNITED STATES PATENTS 3,663,953   5/1972   Salvi ............................... 324/43 R

OTHER PUBLICATIONS

Foner, S.; "Versitile and . . . "; The Rev. of Sci. Inst; vol. 30; No. 7; July 1959; pp. 548–547.

Primary Examiner—R. V. Rolinec
Assistant Examiner—Ernest F. Karlsen
Attorney, Agent, or Firm—Weingarten, Maxham & Schurgin

[57] ABSTRACT

An improved magnetometer for measuring the magnetic moment of a sample. Signals representative of magnetic moment are provided in known phase relation with respect to a driving signal and in phase with the motion of the sample, while spurious signals, such as produced by eddy currents are in an out-of-phase relationship with sample motion. Distortions in the measured magnetic moment due to eddy currents and other out-of-phase spurious signals are eliminated by cancellation of the out-of-phase signals through an AC feedback network.

An output signal comprising the magnetic moment signal and spurious signals is applied to a phase sensitive detector whose DC output represents the amplitude of the spurious out-of-phase signal which it is sought to eliminate. The detector output may be used to control a variable amplifier which in turn supplies an AC signal in a feedback arrangement to either a reference signal source or to summing means which combines the reference signal with the output signal in order to cancel the out-of-phase signal. Alternatively, the AC feedback signal may be supplied by a manually controlled attenuator or amplifier in response to the detector output.

A DC compensating signal proportional to the out-of-phase detector output may also be supplied to the magnetometer output to provide a correction for out-of-phase effects including those which do not exhibit a constant phase relationship to sample motion. The invention is useful with AC magnetometers generally, including vibrating sample, rotating sample and alternating force magnetometers.

22 Claims, 4 Drawing Figures

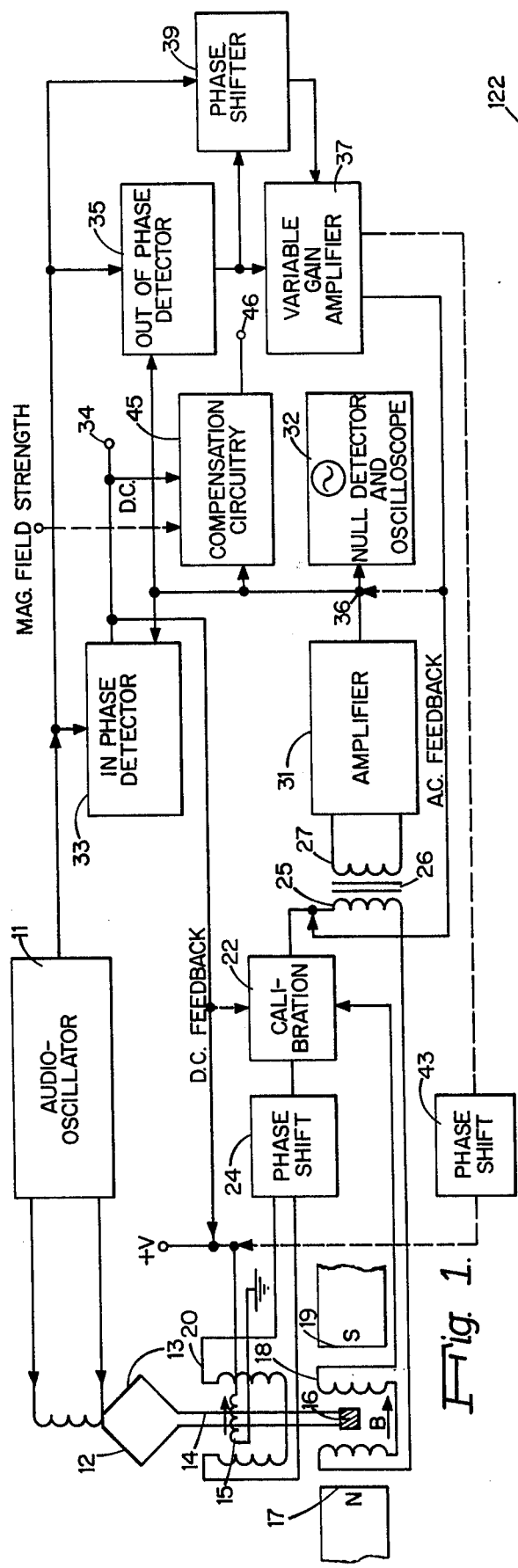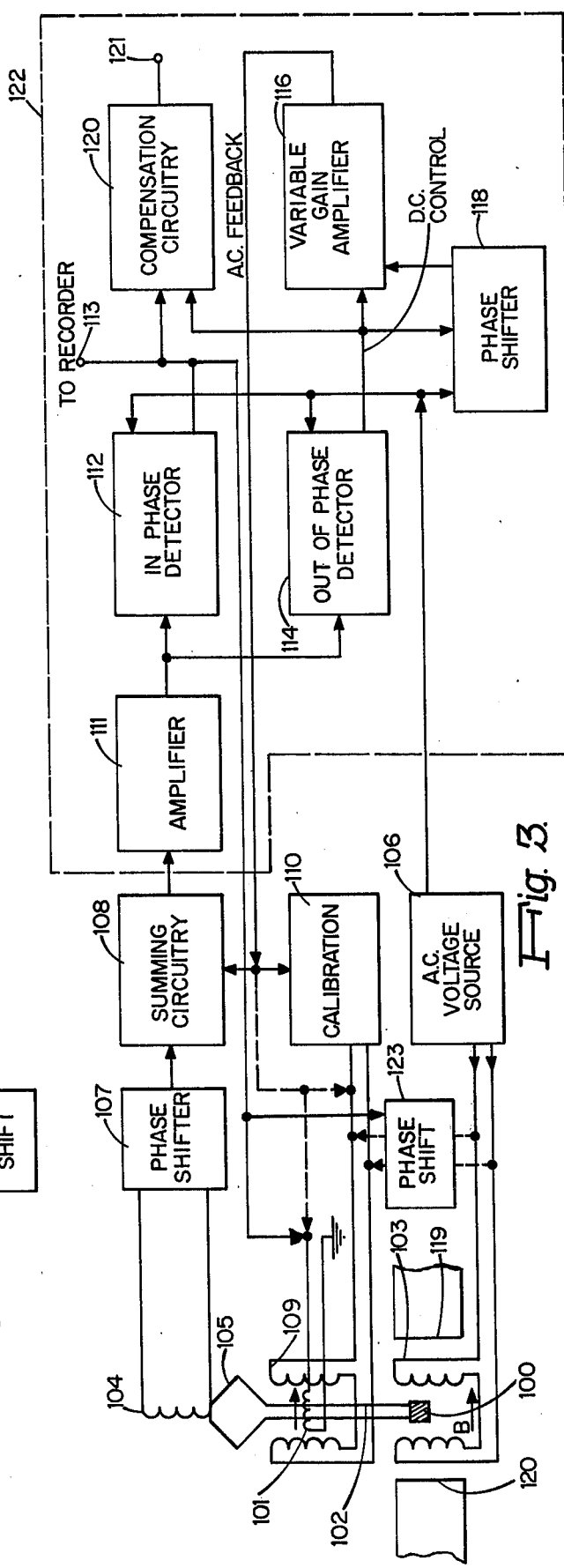

MAGNETOMETER WITH OUT-OF-PHASE CORRECTION

FIELD OF THE INVENTION

The invention relates generally to apparatus for measuring magnetic moment and more particularly to AC magnetometers.

BACKGROUND OF THE INVENTION

By definition, unit magnetization or more specifically, unit magnetic moment in the centimeter-gram-second (CGS) system is possessed by a magnet formed by magnetic poles of opposite sign and of unit strength, one centimeter apart. The magnetic moment may be expressed for example as units per gram of per cubic centimeter. Techniques for measuring the magnetic moment of a material generally fall into one of three broad classes, those involving the measurement of forces resulting when a sample of the material is placed in a non-uniform magnetic field, those involving the measurement of flux changes, and indirect methods.

A preferred vibrating sample magnetometer for measuring magnetic moment which is presently in worldwide use and measures the flux change when a sample is moved in a substantially uniform magnetic field is described in U.S. Pat. No. 2,946,948 of the present inventor. That patent shows the common oscllation of a sample being analyzed and a reference source. A detector such as an inductive coil pickup positioned adjacent to the vibrating sample detects the change of magnetic flux produced by the moving sample and a reference detector disposed adjacent to the reference magnet generates a signal with a known phase relationship to the motion of the sample. The output signal indicating magnetic flux change which is proportional to the sample magnetic moment and the reference signal are differentially combined to provide a null output or a difference signal.

Improvements of the vibrating sample magnetometer of the aforementioned U.S. Pat. No. 2,946,948 are described in U.S. Pat. No. 3,496,459 also of the present inventor. According to that patent, the output signals from the magnetometer are analyzed at a frequency which is an harmonic of the vibration frequency of the sample.

An alternating force magnetometer analogous to the vibrating sample magnetometer described above, but in which force is applied to a sample by subjecting the sample to a periodically varying magnetic field gradient, is described in a paper by R. Reeves, entitled, "An Alternating Force Magnetometer," page 547, Journal of Physics E: Scientific Instruments, 1972, Volume 5.

A rotating sample magnetometer is described in articles by P. J. Flanders, entitled, "Utilization Of A Rotating Sample Magnetometer," Review of Scientific Instruments, Volume 41, No. 5, pp. 697–710, May 1970, and in an article by Stephen J. Hudgens, entitled "Rotating Sample Magnetometer For Diamagnetic Susceptibility Measurements," page 579, Review of Scientific Instruments, Volume 44, No. 5, May 1973.

Motion of conductive materials in an inhomogeneous magnetic field as in the operation of the vibrating sample and rotating sample magnetometers mentioned above, and application of a varying magnetic field to a sample as in alternating force magnetometers generate eddy currents of various strengths which, in turn, produce magnetic flux changes in the region of the sample. Eddy currents are not generated in insulating materials under such conditions since there is no conductive path provided in a sample of insulating material. In general, only negligible eddy currents are produced in ordinary conductive materials moving in a relatively uniform applied magnetic field under normal circumstances. Eddy current effects are particularly significant, however, when a sample is highly conductive and the magnetic moment of the sample which is sought to be measured is relatively small. A relatively pure bulk metal sample or a dilute alloy at low temperatures produces relatively significant eddy currents due to its high conductivity. Superconducting materials can generate extremely high eddy currents when vibrated in non-uniform fields. Even in a uniform magnetic field, significant eddy currents are produced when the sample does not move parallel to the applied field. The eddy current effects may be substantially eliminated by reducing the sample size, by using a powdered sample or by employing a more homogeneous applied field. In many possible applications, however, it is undesirable to alter the configuration of the sample and not feasible to employ a more uniform field. Out-of-phase eddy current effects must therefore be overcome in order to provide accurate measurement of magnetic moment for highly conductive materials or for less conductive materials in non-uniform magnetic fields.

In addition to eddy currents, a number of other out-of-phase signal components may distort the output indication of magnetic moment. Out-of-phase components may result, for example, when (a) the applied field is swept and the change in flux over time has various frequency components; (b) when the sample moves along an axis which is not parallel to the magnetic field lines; (c) when the sample mounting has mechanical resonances; (d) when the motion of the sample is hindered by binding to the driving mechanism so that the sample drive is not perfectly sinusoidal; (e) when vibrational noise is detected; and (f) when a mechanical driver is mechanically coupled to the detection coils.

SUMMARY OF THE INVENTION

According to the present invention, an improved magnetometer is provided for measuring the magnetic moment of a sample. In a vibrating sample magnetometer, a driving force is applied to a sample causing it to vibrate and the change in magnetic flux in the vicinity of the sample is measured by a magnetic flux detector. A similar detector, adjacent a known reference source which is rigidly coupled to the sample for common movement therewith may also be employed to provide a reference signal. The output of the detector is an AC signal including signal components, in phase with sample vibration and indicating magnetic moment, and out-of-phase spurious signals caused by eddy currents or other causes. This output signal is applied to a phase sensitive detector which isolates one or more spurious out-of-phase signals. The DC output of the out-of-phase signal detector indicating the amplitude of the isolated signal is then employed either manually or automatically to control the amplitude of an out-of-phase AC signal supplied in a feedback loop for cancellation of the out-of-phase signal either to the detector, reference signal source or summing circuitry which combines the flux detector output and the reference signal.

The output of the out-of-phase signal detector may also be employed to generate a DC compensating signal which may be added to the magnetometer output to provide a correction for out-of-phase effects including those which do not exhibit a constant phase relationship to the vibration of the sample.

Vibrating sample, rotating sample and alternating force magnetometers, in which a driving field is applied to a sample and the force on the sample sensed, may be constructed according to the invention. Magnetometers of all these types and in which output signals from the flux detector which are harmonics of the driving signal frequency are analyzed may also be constructed according to the invention.

DESCRIPTION OF THE DRAWING

The objects, advantages and features of this invention will become readily apparent from the following detailed description when taken in conjunction with the accompanying drawing, in which:

FIG. 1 is a block diagram in schematic form of a vibrating sample magnetometer constructed according to the invention;

FIG. 3 is a block diagram in schematic form of an alternating force magnetometer constructed according to the invention;

DETAILED DESCRIPTION OF THE INVENTION

Figure 2:
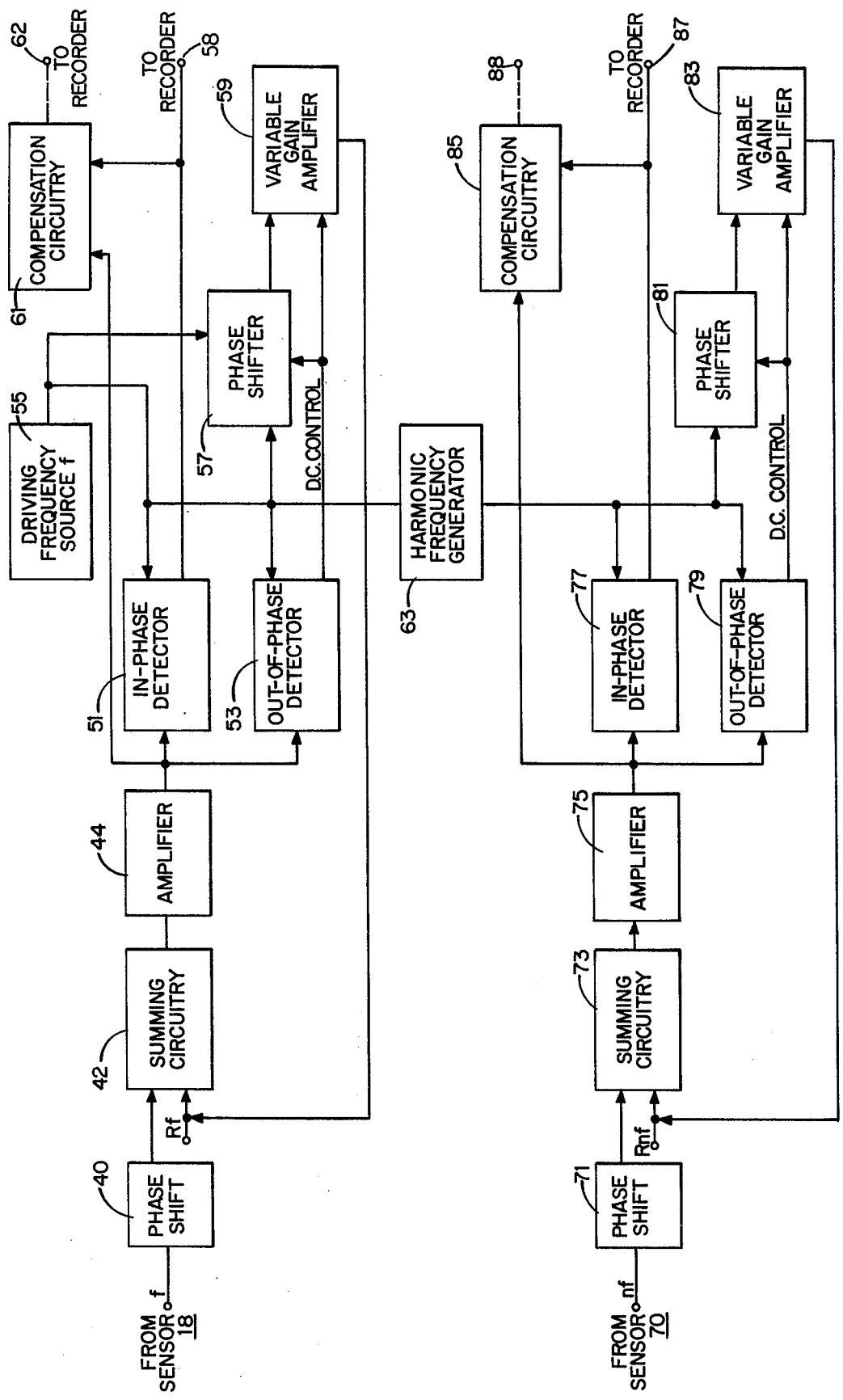
FIG. 2 is a block diagram in schematic form of another embodiment of a vibrating sample magnetometer constructed according to the invention.

According to the invention, a magnetometer is provided with circuitry for cancellation of spurious out-of-phase signals arising from eddy currents or other sources.

Various types of magnetometers may be constructed with out-of-phase signal cancellation circuitry according to the invention. Examples of magnetometers which may be constructed according to the invention include vibrating sample magnetometers as described in the aforesaid U.S. Pat. Nos. 2,946,948 and 3,496,459, and alternating force magnetometers as described by Reeves, supra.

The invention will first be described in the context of vibrating sample magnetometers in which a sample is caused to undergo periodic motion in a substantially uniform magnetic field. As will be described hereinafter, improved alternating force magnetometers employing a varying magnetic field may also be constructed according to the invention.

A preferred embodiment of a conventional vibrating sample magnetometer is described in the aforesaid U.S. Pat. No. 2,946,948 of the present inventor and the disclosure of that patent is incorporated herein by reference. Referring to FIG. 1, a typical embodiment of a preferred vibrating sample magnetometer constructed and operative according to the invention is illustrated in diagrammatic form. As taught by U.S. Pat. No. 2,946,948, audio oscillator 11, providing a low frequency signal, for example, 90 cycles per second, energizes a loud speaker 12 whose diaphragm is joined by conic support member 12 to a rod 14. A reference 15 and a sample 16 of material whose magnetic moment is to be measured are rigidly secured in fixed spaced relationship on the rod for common vibration in response to the driving signal from oscillator 11 and within a known substantially uniform magnetic field indicated in the drawing by the arrow B provided between the opposite pole faces 17 and 19 of a magnet. Alternatively, instead of an audio oscillator, other driving means may be employed, such as electrostrictive or motor drives, and the rod may be moved horizontally or in rotational or orbital motion or alternatively in a combination of known motions. Motion of the sample may be in a plane which is perpendicular to the magnetic field as shown in FIG. 1 or alternatively parallel to an applied magnetic field. An AC magnetic flux sensor 18, typically comprising a pair of inductive pickup coils, is disposed adjacent sample 16 in the magnetic field. A second sensor 20, also comprising a pair of inductive coils, is disposed adjacent reference 15. Sensors 18 and 20 are preferably configured as taught in U.S. Pat. No. 2,946,948 to provide cancellation of spurious signals from external sources.

As an alternative, the sample may be moved or vibrated in periodic motion at a first point and then displaced and similarly vibrated or moved at a second point in a different environment to provide a comparison of magnetic moments of the sample under different conditions, such as different temperature environments. In such a case, two sets of sensors 18 and 20 would have to be provided.

In the preferred embodiment, reference source 15 is a magnet positioned so that its poles fal along a line which passes through and is perpendicular to the axis of the coils of sensor 20. As an alternative, the reference magnet may be replaced by a capacitor or a source of optical energy and sensor 20 may be a capacitor which senses changes in capacitance, or an optical displacement sensor. Whatever type of sensor is employed, it is preferably configured to have symmetry which is compatible to that of sensor 18 to provide insensitivity to the position of reference source 15 to first order so that the reference signal is proportional to the oscillation amplitude of reference source 15.

Sample 16 is effective to distort the magnetic field B in its immediate vicinity, the degree of such distortion being related to the direction and magnitude of the magnetic moment of the sample for a given applied field. The distortion is sensed by the coils of sensor 18 in a manner similar to the detection of motion of the reference source 15. Sensor 18 may alternatively comprise a magnetoresistive, Hall effect, super-conductive or other magnetic field sensitive device which is able to sense the magnetic field distortion produced by motion of the sample. Whatever type of sensor is employed, it is configured to eliminate spurious signals due to stray field effects insofar as possible so that the signal output of the sensor reflects as closely as possible only the field produced by the oscillating sample 16.

As noted above, it is appreciated that sensor 18 also detects the presence of eddy currents in the sample when the sample is conductive. The distortion of the signal output of the sensor 18 by the eddy currents may not be significant unless a highly conductive sample is employed in nonuniform field conditions. For the purposes of describing the present invention, it will be assumed that significant eddy currents or other out-of-phase components are produced and reflected in the output of sensor 18.

The signal derived at sensor 20 is applied to phase-shift network 24. Network 24 permits adjustment of the phase of the reference signal from sensor 20 so that the reference signal output from sensor 20 is in a desired phase relationship. The phase-shifted output of network 24 is supplied to calibration circuitry 22 which may comprise a precision potentiometer or alternatively a variable amplifier controlled by a feedback signal from phase detector 33, as will be described hereinafter.

The AC reference signal output from calibration circuitry 22 whose phase is caused to coincide with the phase of the sensor 18 output by phase shifting in network 24 is differentially combined with the signal derived from sensor 18 at a primary 25 of a transformer 26 or other summing circuit to provide a difference output signal at secondary 27 which is in turn applied to an amplifier 31.

A null detector and oscilloscope 32 may be employed to indicate the magnitude of the signal output of amplifier 31. In one mode of operation, calibration circuitry 22 is adjusted until oscilloscope 32 indicates a minimum signal output. The setting of calibration circuitry 22 under this condition is then indicative of the magnetic moment of sample 16. Calibration of the apparatus is readily accomplished by inserting samples of known weight and magnetic characteristics and noting the calibration circuitry setting for known magnetic moment. Once this calibration procedure is initially accomplished, other samples may be readily and accurately measured.

In a preferred mode of operation where a recorder is employed, the setting of calibration circuitry 22 is fixed and the output of amplifier 31 is supplied to phase-sensitive detector 33 which also receives a reference signal from oscillator 11 having a known phase relationship to the vibration of the sample. Detector 33 provides a continuous DC signal output at terminal 34 indicating the value of the magnetic moment of the sample and suitable for energizing a conventional signal recorder. The output of phase-sensitive detector 33 may also be provided as a feedback to a reference electromagnet 15 or to calibration circuitry 22 as noted above. Alternatively, an independently selectable voltage may be supplied at terminal +V.

The feedback signal supplied from the output of phase-sensitive detector 33 to the reference provides an alternative way of balancing the conventional vibrating sample magnetometer where the reference is an electromagnet or a capacitor or any other device furnishing a reference signal output. Where an electromagnet reference source is employed, the DC output from detector 33 varies the field produced by the electromagnet resulting in the provision of a variable feedback reference control for balancing purposes. Alternatively, where the reference source 15 is itself not variable, feedback from phase detector 33 to calibration circuitry 22 may be used for balancing. An analogous feedback circuit may be employed to vary the capacitor voltage where the reference source is a capacitor.

The output of amplifier 31 together with a reference signal from oscillator 11 is also supplied to a second phase-sensitive detector 35 which detects signals in an out-of-phase relationship with the vibration of the sample. Out-of-phase detector 35 may be set to detect signals which are in a predetermined phase relationship such as 90° out of phase with sample vibration and which include signals produced by eddy currents generated in a conductive sample. Alternatively, detector 35 may be a tracking phase detector and provide an output indication of the amplitude of an out-of-phase signal of varying phase. The DC output voltage from detector 35 is supplied as a voltage control input to a voltage controlled variable gain amplifier 37 such as a Burr-Brown analog multiplier or to a variable resistance divider or similar device in order to vary the amplitude of a phase-shifted reference signal substantially identical in phase with the signals detected by detector 35. The reference signal is provided by phase-shifting circuitry 39 in response to a signal received from audio oscillator 11. Where the signal supplied by circuitry 39 is in a variable phase relationship with respect to the driving signal, an output from detector 35 is supplied as a control input to the phase shifter for providing automatic phase variation of the phase-shifted output.

According to an alternative embodiment of the invention, the output of detector 33 may be employed to provide a sensible output indication to an operator. Instead of variable gain amplifier 39, a manually controllable voltage divider may be provided to produce an AC feedback signal.

The output of variable gain amplifier 37 is a signal in phase with the detected out-of-phase signal and which has an amplitude substantially identical and of opposite sense to the out-of-phase signal content at the output of amplifier 31. In one embodiment of the invention this output signal is supplied to the primary of transformer 26 together with the reference signal from calibration circuitry 22 and the output of coil 18 in order to cancel the detected out-of-phase components. Alternatively, the output signal may be supplied at the junction 36 and combined with the output of amplifier 31.

As a further alternative, the output of variable gain amplifier 37, instead of being applied to the primary of transformer 26, may be applied as an additional voltage input to electromagnet reference 15 to produce an additional reference signal which will in effect cancel out the out-of-phase components sensed by sensors 18 and 20. This voltage feedback is phase-shifted in phase-shift network 43 to compensate for any phase shift in the associated coupling circuitry.

In the embodiment where a feedback loop is operative for cancelling only signals having a particular out-of-phase relationship to the driving signal, as where detector 35 is set to detect only 90° out-of-phase signals, it may be desirable to additionally cancel signals having different phase relationships with the driving signal by providing additional feedback loops, each comprising an out-of-phase signal detector and variable amplifier.

As an alternative to AC feedback through amplifier 37 or in addition to AC feedback, compensation for distortions at the in-phase signal output of phase detector 33 may be provided by compensation circuitry 45 which receives an input from amplifier 31, and from detector 33 and provides an output at terminal 46.

In one embodiment, compensation circuitry includes a vector voltmeter for resolving the output signal from amplifier 31 into in-phase and out-of-phase components. Compensation circuitry 45 then provides a correction to the in-phase output of detector 33 which is proportional to a trigonometric function of the phase difference between the out-of-phase and in-phase signals. Alternatively, compensation circuitry 45 may comprise a variable gain amplifier responsive to an input indicating magnetic field strength at the sample to provide a calibrated output correction which is a function of the applied field strength.

A situation where the use of compensation circuitry may be particularly useful occurs when the out-of-phase signal has a variable phase relationship to the driving signal. Where detector 35 is a fixed phase detector, the entire out-of-phase component cannot be cancelled by the AC feedback circuitry. In such a case, compensation circuitry 45 is operative to correct the in-phase output signal by cancelling in-phase components of even non-linear variable phase signals.

It should be noted, however, that the use of compensation circuitry 45 to cancel components of the output signal which result from the presence of out-of-phase signals has the disadvantage that there is no feedback to the signal input and linearity of the relationship between the two signals combined in circuitry 45 must be assumed.

The out-of-phase signal component may also be recorded and analyzed if of interest by examining the output of detector 35 or of compensation circuitry 45. For example, the out-of-phase signal component at the output from detector 35 reflects a quantity which involves the field gradients of the magnet and the sample conductivity. The output for a known sample shape may be used to determine conductivity versus field or temperature when the field gradients are known or calibrated. Conversely, with a known sample, the field gradient and changes may be examined.

An improved magnetometer of the general type disclosed in U.S. Pat. No. 2,946,948 and in which the magnetic moment is detected at frequencies which are harmonics of the frequency of sample vibration aplied to the sample is described in U.S. Pat. No. 3,496,459, also of the present inventor. Output signals at harmonics of the sample vibrator frequency may also be produced by the apparatus illustrated in FIG. 1 in the presence of certain magnetic field configurations produced by pole faces 17 and 19. Eddy currents which result from nonuniformities in an applied field or other out-of-phase components may interfere with magnetic moment detection at fundamental as well as harmonic frequencies. In order to eliminate eddy current effects and the effects of spurious out-of-phase signals on the detected magnetic moment, a feedback network similar to that illustrated in FIG. 1 for fundamental frequency magnetic moment detection may be employed.

U.S. Pat. No. 3,496,459 describes a vibrating sample magnetometer having a plurality of magnetic flux sensors each operative at a different harmonic of the vibrating frequency of the sample. An embodiment of the invention in which harmonics of the vibrating frequency are detected in the manner described in that patent is illustrated in FIG. 2. A first phase shift network 40, similar to network 24 in FIG. 1, receives a signal at the driving signal frequency from sensor 18 (FIG. 1) and provides an output signal to summing circuitry 42, which also receives a reference signal Rf from calibration circuitry 22 (not shown) at the driving signal frequency. An amplifier 44 receives the differentially summed output of circuitry 42 and provides an output to a phase detector 51 which detects and amplifies signals in phase with the driving signal frequency. Amplifier 44 also provides an output signal to phase detector 53 which detects signals which are out of phase with the driving frequency. The driving signal source 55, such as an audio oscillator, provides an input signal at the driving signal frequency to detector 51, detector 53 and to phase-shifting circuitry 57 The output of phase-shifter 57 is applied as an input to a variable gain amplifier 59 whose gain is controlled by the DC output of detector 53. The output of detector 53 may also be applied to phase-shifting circuitry 57 to permit automatic phase variation of the phase-shifted output. The output of variable gain amplifier 59 is applied as a feedback signal to summing circuitry 42 or alternatively to sensor 18 or a reference signal source (FIG. 1) to provide cancellation of out-of-phase components arising from eddy currents as well as other spurious signals. Alternatively, a manually adjustable voltage divider or similar device may be employed instead of a variable gain amplifier to provide a feedback signal.

A control signal from amplifier 44 may be supplied additionally to compensation circuitry 61 which, similarly to circuitry 45 (FIG. 1), provides a calibrated DC output to recorder terminal 62 representing the in-phase signal and in which the in-phase signal components of spurious signals are cancelled. If DC signal compensation is not required, circuitry 61 may be eliminated and a recorder may be connected directly to the output terminal 58 of detector 51.

A second sensor 70 (not shown), adjacent the vibrating sample whose magnetic moment is being determined, provides an output signal at a harmonic n of the driving signal frequency f to phase-shifting circuitry 71 whose output in turn is supplied to summing circuitry 73. A reference signal R of frequency nf is also supplied to the summing circuitry at the detected harmonic of the driving frequency from a suitable sensor (not shown) disposed adjacent the reference. This nf signal could also be obtained by generating harmonics of the driving frequency reference signal at nf and of an amplitude proportional to the driving signal amplitude. The output of summing circuitry 73 is supplied to an amplifier 75 whose output is in turn supplied to a phase-sensitive detector 77 which detects signals which are in phase with the selected harmonic nf of sample motion and to a phase detector 79 which detects signals which are out of phase with the selected harmonic of the sample motion.

Detector 77 also receives a reference signal in phase with the sample motion at the selected harmonic frequency from a harmonic frequency generator 63 which in turn receives an output signal at the driving frequency from source 55. The output of harmonic frequency generator 63 is also supplied to detector 79 and to phase-shifting circuitry 81 which is operative to shift the phase of the received signal and whose output is applied to a variable gain amplifier 83. The output of phase-sensitive detector 79 is applied as a DC control signal to variable amplifier 83 and as a control signal to phase-shifting circuitry 81, similary to the above-described driving frequency channel. The output of variable amplifier 83 which is out of phase with respect to the selected harmonic of the driving frequency and has an amplitude proportional to that of the out-of-phase signal detected by out-of-phase detector 79, is applied as a cancelling feedback signal to summing circuitry 73, or alternatively, to the sensor or reference signal source Compensation circuitry 85 may also be provided to operate on the nf signal similarly to circuitry 61 and supplies a calibrated output at recorder terminal 88 in which out-of-phase components of spurious signals are cancelled. If DC signal compensation is not required, circuitry 85 may be eliminated and a recorder may be connected directly to the output terminal 87 of detector 77.

In a magnetometer in which magnetic moment is detected at one or more harmonic frequencies, a feedback loop comprising an out-of-phase signal detector and a variable amplifier must be provided for each detected harmonic frequency of interest.

Analogous to the vibrating sample magnetometer described above and taught in U.S. Pat. No. 2,946,948 is an alternating force magnetometer which employs the principles of the vibrating sample magnetometer to measure a magnetic moment by analyzing the motion of a sample in an applied AC magnetic field. One embodiment of such an alternative force magnetometer is suggested in the aforesaid article by R. Reeves, supra.

An alternating force magnetometer constructed and operative according to the invention is illustrated schematically in FIG. 3. Similarly to the structure of the vibrating sample magnetometer shown in FIG. 1, a sample 100 whose magnetic moment is to be measured is mounted on a rod or other support member 102 which in turn is supported on a transducer 104 such as by the cone portion 105 of a loudspeaker or other electric or electromagnetic transducer. An AC source 106 supplies an AC driving signal to coils 103 disposed adjacent sample 100 thereby providing an AC magnetic field gradient in the vicinity of the sample. The presence of an AC magnetic field gradient at the sample results in an AC force being developed at the sample, which force is transmitted along rod 102 to transducer 104. The forces applied to transducer 104 are there converted to an AC voltage indicating force and applied through phase-shifting circuitry 107 to summing circuitry 108. A reference signal is derived from sensor coils 109 which sense the AC applied field in the vicinity of a reference source 101, such as a magnet, and is applied to calibration circuitry 110. The output of the calibration circuitry is differentially combined with the phase-shifted AC force signal in summing circuitry 108.

The output of summing circuitry 108 is applied to an amplifier 111. The output of amplifier 11 is applied to an in-phase signal detector 112 and to an out-of-phase signal detector 114. Detectors 112 and 114 also receive an AC input from source 106. The output of detector 112 is connected to a recorder terminal 113 and provides an indication of magnetic moment of the sample. The output of detector 114 is a DC control signal which governs the gain of a variable gain amplifier 116 which also receives a phase-shifted AC voltage signal from phase-shift network 118. Network 118 receives an AC signal from source 106 and may also receive a DC control signal from phase detector 114 to provide automatic phase variation. The output of variable gain amplifier 116 is a signal, out of phase with the sample motion and having an amplitude proportional to the out-of-phase signal amplitude. This AC signal is fed back to the reference input of summing circuitry 108 in order to cancel spurious out-of-phase signal components such as those arising from eddy currents or other spurious signal sources. It may thus be appreciated that the processing circuitry contained in block 122 is substantially similar to that employed in the vibrating sample magnetometer illustrated in FIG. 1.

Calibration circuitry 120 combines a signal proportional to the out-of-phase spurious signals, but of the opposite polarity, with the output from detector 112 in order to cancel the spurious signal components in the DC output signal indicating in-phase amplitude supplied at recorder terminal 121. Where DC compensation is not desired, recorder terminal 113 is employed.

Alternatively, the electromagnetic driving and detecting system could be replaced by an electrostrictive or electrostatic pickup, in which case the coils would be replaced by a corresponding transducer.

Where the reference source 101 is an electromagnet, the magnetometer may be balanced by the DC output from in-phase detector 112 to electromagnet 101. Alternative implementations of the AC feedback circuitry include applying the AC feedback output from variable gain amplifier 116 to coils 109 or alternatively supplying the AC feedback to electromagnet 101.

As an alternative embodiment of an AC force magnetometer, sensors 109 may be replaced by coils which produce an AC gradient field for generating a force on a reference electromagnet or permanent magnet sufficient to cancel the resultant forces on the driven sample rod. Circuitry employed in this alternative embodiment is illustrated by the dashed lines which indicate that the AC feedback output of source 106 is applied directly to coils 109 via phase-shift circuitry and variable gain amplifier 123. The amplitude of the AC drive is controlled by the output from detector 112 for automatic null balance by manual adjustment of the gain. Calibration circuitry 110 is eliminated in the alternative embodiment.

Where the absence of motion is detected in an AC force magnetometer, the out-of-phase AC signal provided by variable gain amplifier 116 may be fed back directly to coils 109 and superimposed on an AC drive signal from source 106 when the reference 101 is a permanent magent. Where reference 101 is an electromagnet, the AC feedback signal may be supplied either directly to the electromagnet or to coils 109.

In the alternating force magnetometer, analysis of the magnetic moment may alternatively be accomplished at frequencies which are a harmonic of the AC driving signal or at other frequencies. By analogy to the vibrating sample magnetometer operative for detection at harmonics of the driving frequency shown in U.S. Pat. No. 3,496,459, in the alternating force magnetometer a coil configuration similar to that used in harmonic frequency detection in the vibrating sample magnetometer can be used to generate forces at harmonics of the AC driving signal frequency and thus discriminate against the driving frequency signal.

The AC feedback circuitry described in connection with the AC force magnetometer is analogous in principle and in operation to that employed in the vibrating sample magnetometer illustrated in FIGS. 1 and 2. Similarly, DC signal compensation at the DC output recorder terminal 113 of the circuit may also be employed in a manner analogous to that shown in FIGS. 1 and 2.

As has been described above, significant distortions occur in vibrating sample magnetometers in the presence of field nonuniformities as well as due to other sources. Vibrating sample magnetometers encounter eddy current problems in the presence of nonuniformities in the applied field and particularly where highly conductive materials are being tested or when testing occurs at particularly low temperatures. An AC force magnetometer, however, employs a varying magnetic field which produces significant eddy currents in a conductive sample as well as in the pole faces 119 and 120 of the electromagnet adjacent the sample.

Both the vibrating sample magnetometer and the alternating current force magnetomer illustrated in FIGS. 1 and 3 respectively may be constructed in an alternative embodiment in which a reference signal is not directly mechanically coupled to the drive member. In such an embodiment, the magnetometer illustrated in FIG. 1 would be modified by eliminating voltage source 117, electromagnet 15, coils 20, calibration circuitry 22 and phase shift network 24, all of which would not be necessary. In FIG. 3 the reference coil 109 and calibration circuitry 110 would be eliminated.

Elimination of a reference signal involves two distinct disadvantages: The first is that effects of nonlinearly or drift in amplifier gain are not automatically cancelled by differential summing in the summing circuitry. The second is that changes or drift in the amplitude of vibration in the vibrating sample magnetometer or the amplitude of the AC driving signal supplied to coils 108 in the AC force magnetometer are also uncompensated.

Figure 4:
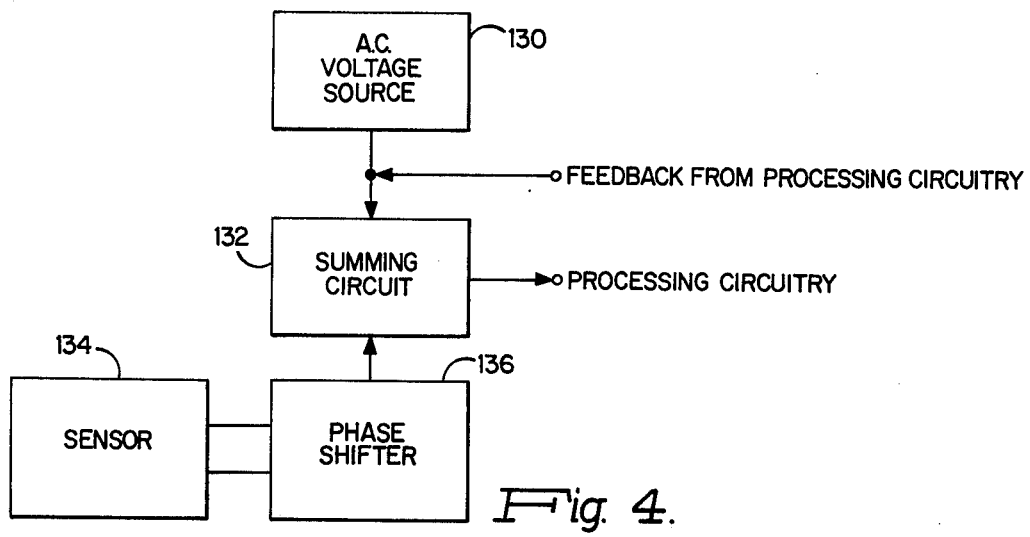
FIG. 4 is a block diagram in schematic form of another embodiment of a magnetometer constructed according to the invention.

The above disadvantages may be partially overcome by replacing the reference signal previously supplied from a separate reference source with a reference signal such as a driving signal directly from an AC source which may be the same audio oscillator which provides the driving signal to the sample. Circuitry in which the driving signal is employed as a reference signal is shown schematically in FIG. 4. A source 130 such as an audio oscillator or any other AC voltage source provides a reference signal to summing circuitry 132. Signals from a sensor, which in a vibrating sample magnetometer comprises field sensor coils and in an alternating force magnetometer comprises a force transducer, are provided to a phase-shifter 136 which coordinates the phases of the received sensor signal and the reference signal from source 130. These two signals are differentially combined in summing circuitry 132 and the summed output is supplied to the processing circuitry which has been described above. The feedback from the processing circuitry is applied to the summing circuitry together with the reference signal for cancellation of the out-of-phase components in a manner analogous to that described above.

It is appreciated that as an alternative embodiment of the invention the variable gain amplifier may be omitted and the output of the out-of-phase detector analyzed to determine sample conductivity or eddy current effects.

Numerous modifications of the departures from the specific embodiment and variations thereof described herein will be apparent to those skilled in the art without departing from the inventive concept. Consequently, the invention is to be construed as limited only by the spirit and scope of the appended claims.

What is claimed is:

1. A magnetometer including:
a sample and predetermined sample environment:
driving means for applying an AC driving signal to said sample and for providing an AC output indication representative of the response of said sample to said driving signal;
said sample and predetermined sample environment being of a type whereby said output indication contains a first signal component indicating magnetic moment of said sample in an expected phase relationship with the $n$'th harmonic (where $n$ is a positive integer) of said driving signal and at least one second signal component, out of phase with said first signal component and not correspondingly representative of magnetic moment of said sample;
means for substantially compensating for said at least 1 second signal component in said output indication comprising:
detector means responsive to said at least 1 second signal component for providing in response to said second signal component an output signal indicating said at least 1 second signal component;
correction means operative in response to said detector output signal and said output indication to substantially cancel said at least 1 second signal component in said output indication, thereby to provide a corrected output indication more accurately representing magnetic moment.

2. The invention according to claim 1 wherein said correction means comprises:
at least one feedback loop through which a signal proportional to said at least 1 second signal component is subtracted from said output indication to provide cancellation of said at least 1 second signal component.

3. In a magnetometer including means for applying a driving signal to a sample and for providing an output indication containing a first signal component indicating magnetic moment of said sample in an expected phase relationship with the $n$'th harmonic (where $n$ is a positive integer) of said driving signal and at least 1 second signal component, out of phase with said first signal component, means for substantially compensating for said at least 1 second signal component in said output indication comprising:
detector means for detecting said at least 1 second signal component and providing in response to said output indication an output signal indicating said at least 1 second signal component;
correction means operative in response to said detector output signal and said output indication to substantially cancel said at least one second signal component in said output indication, thereby to provide a corrected output indication representing magnetic moment;
said correction means comprising at least one feedback loop through which a signal proportional to said at least one second signal component is subtracted from said output indication to provide cancellation of said at least 1 second signal component;
said feedback loop comprising:
phase-shifting means receiving said driving signal and providing in response thereto a phase-shifted signal substantially in phase with said at least 1 second signal component;
variable gain amplifier means receiving the outputs of said phase-shifting means and said detector means and providing an AC feedback signal substantially in phase with and of an amplitude substantially equal to said at least 1 second signal component but of opposite sense; and
coupling means for combining said AC feedback signal with said output indication for cancellation of said at least 1 second out-of-phase signal component in said output indication.

4. The invention according to claim 3 wherein said coupling means comprises differential summing means receiving as inputs said output indication from said sensing means and said AC feedback signal.

5. The invention according to claim 3 and further comprising:
  compensation circuitry receiving said output indication and providing a corrected output indication including a correction component representing a predetermined function of said at least one second signal component, said correction component providing a correction for distortion in said output indication resulting from the presence of said at least one second signal component.

6. The invention according to claim 3 wherein said detector means comprises a tracking phase-sensitive detector operative to provide an output indication of out-of-phase signals of varying phase.

7. The invention according to claim 3 wherein said coupling means provides said AC feedback signal to an input of said summing means.

8. In a magnetometer including means for applying a driving signal to a sample and for providing an output indication containing a first signal component indicating magnetic moment of said sample in an expected phase relationship with the $n$'th harmonic (where $n$ is a positive integer) of said driving signal and at least 1 second signal component, out of phase with said first signal component, means for substantially compensating for said at least 1 second signal component in said output indication comprising:
  detector means including compensation circuitry having a vector volt meter for detecting said at least 1 second signal component and providing in response to said output indication an output signal indicating said at least 1 second signal component;
  correction means operative in response to said detector output signal and said output indication to substantially cancel indication, thereby to provide a corrected output indication representing magnetic moment.

9. A magnetometer including:
  a sample and a predetermined sample environment;
  driving means for applying a driving signal to said sample and for providing an output indication representative in part of magnetic moment;
  said sample and predetermined sample environment being of a type whereby said output indication contains a first signal component indicating magnetic moment of said sample in an expected phase relationship with the $n$'th harmonic (where $n$ is a positive integer) of said driving signal and at least 1 second signal component, out of phase with said first signal component and not correspondingly representative of magnetic moment of said sample;
  means for sensing said at least 1 second signal component to provide an indication of conductivity of or field distribution in the sample comprising:
  detector means responsive to said at least 1 second signal component for providing in response to said second signal component of said output indication a detector output signal indicating said at least 1 second signal component.

10. The invention according to claim 9 wherein said detector means comprises a phase-sensitive detector.

11. The invention according to claim 9 wherein said detection means comprises a tracking phase-sensitive detector operative to provide an output indication of out-of-phase signals of varying phase.

12. A magnetometer comprising:
  means for applying an AC driving signal to a sample;
  a reference signal source rigidly mounted in spaced relationship to said sample;
  first sensor means disposed adjacent said sample for sensing the magnetic flux in the vicinity of said sample;
  second sensor means disposed adjacent said reference source for sensing the magnetic flux in the vicinity of said reference source;
  differential summing means receiving output signals from said first and second sensor means and providing an output signal including a first signal component in phase with the motion of said sample indicating magnetic moment of said sample and at least 1 second signal component out of phase with said sample motion;
  phase detector means receiving the output from said summing means and providing a DC output representing the amplitude of said at least 1 second signal component;
  phase-shifting means receiving said driving signal for providing a phase-shifted output in phase with said at least 1 second signal component;
  variable gain amplifier means operative in response to a gain control signal from said phase detector means to vary the gain of the received phase-shifted output from said phase-shifting means thereby to provide a correction signal substantially identical in phase and amplitude, but of opposite polarity to said at least one second signal component;
  means for combining said correction signal with the outputs of said first and second sensor means to substantially cancel said at least 1 second signal component;
  means for providing a corrected output indication of magnetic moment in response to the combined signals from said first and second sensor means and said variable gain amplifier.

13. A magnetometer according to claim 12 and comprising second phase detector means receiving the outputs from said summing means and providing a DC output representing said first signal component.

14. A magnetometer according to claim 13 and comprising circuitry for applying the output of said second phase detector to said second sensor means as a DC feedback for balancing said output signals from said first and second sensor means.

15. A magnetometer according to claim 13 wherein said reference source comprises an electromagnet and said second phase detector provides an output signal to said electromagnet for balancing said output signals from said first and second sensor means.

16. A magnetometer according to claim 13 and also comprising compensation circuitry receiving an input signal from said differential summing means and a signal from said second phase detector means and providing the corrected output indication of said first signal component including a correction component proportional to a function of said at least 1 second signal component.

17. A magnetometer according to claim 13 and comprising compensation circuitry receiving the output of said second hase detector means and an input signal indicating the applied magnetic field at said sample and providing a corrected output signal indicating magnetic moment.

18. A magnetometer comprising:

means for mounting a sample in an applied magnetic field;

a reference signal source rigidly mounted in spaced relationship to said sample;

first electrical transducer means disposed adjacent said sample and receiving an AC driving signal for providing an AC magnetic field in the vicinity of said sample;

second electrical transducer means disposed adjacent said reference source providing a reference signal;

force transducer means for providing an electrical output signal indicating force applied to said sample;

differential summing means receiving the output signals from said second electrical transducer and said force transducer and providing an output signal including a first signal component in phase with the force on said sample indicating magnetic moment of said sample and at least 1 second signal component out of phase with said sample force;

first phase detector means receiving the output of said summing means and providing a DC output representing said at least 1 second signal component;

phase-shifting means receiving said driving signal for providing a phase-shifted output in phase with said at least 1 second signal component;

variable gain amplifier means operative in response to a gain control signal from said first phase detector means to vary the gain of the received phase-shifted output from said phase-shifting means thereby to provide a correction signal substantially identical in phase, but of opposite polarity to said at least 1 second signal component;

means for combining said correction signal with the outputs of said second electrical transducer and said force transducer to substantially cancel said at least 1 second signal component;

means for providing a corrected output indication of magnetic moment in response to the combined signals from said force transducer and second transducer and said variable gain amplifier.

19. A magnetometer according to claim 18 and also comprising second phase detector means receiving the output from said summing means providing a DC output representing said first signal component.

20. A magnetometer according to claim 18 wherein said means for combining comprises an electrical connection from the output of said variable gain amplifier to said second electrical transducer to provide automatic force balancing of said magnetometer.

21. A magnetometer according to claim 19 wherein said reference signal source comprises an electromagnet receiving a DC output from said second phase detector means.

22. A magnetometer according to claim 21 also comprising means for applying a phase-shifted AC voltage signal to said second electrical transducer means to enable automatic force balancing of said magnetometer.

* * * * *

UNITED STATES PATENT AND TRADEMARK OFFICE
CERTIFICATE OF CORRECTION

PATENT NO. : 4,005,358
DATED : January 25, 1977
INVENTOR(S) : Simon Foner

It is certified that error appears in the above-identified patent and that said Letters Patent are hereby corrected as shown below:

Column 1, line 16, "of" should read --or--; and
         line 28, "oscllation" should read --oscillation--.
Column 4, line 29, "fal" should read --fall--.
Column 7, line 34, "aplied" should read --applied--.
Column 8, line 1, "57 The" should read --57. The--; and
         line 55, "similary" should read --similarly--.
Column 9, line 43, "11" should read --111--.
Column 13, line 37, "cancel indication" should read --cancel said at least one second signal component in said output indication--.
Column 14, line 64, "hase" should read --phase--.

Signed and Sealed this

Twenty-fourth Day of May 1977

[SEAL]

Attest:

RUTH C. MASON
Attesting Officer

C. MARSHALL DANN
Commissioner of Patents and Trademarks

UNITED STATES PATENT AND TRADEMARK OFFICE
CERTIFICATE OF CORRECTION

PATENT NO. : 4,005,358
DATED : January 25, 1977
INVENTOR(S) : Simon Foner

It is certified that error appears in the above-identified patent and that said Letters Patent are hereby corrected as shown below:

Under OTHER PUBLICATIONS, it should read --Foner, S.; "Versitile and . . ."; The Rev. of Sci. Inst; vol. 30; No. 7; July 1959; pp. 548-557 --.

Signed and Sealed this ninth Day of August 1977

[SEAL]

Attest:

RUTH C. MASON
Attesting Officer

C. MARSHALL DANN
Commissioner of Patents and Trademarks